United States Patent [19]
Suzuki

[11] Patent Number: 5,917,581
[45] Date of Patent: Jun. 29, 1999

[54] PROJECTION EXPOSURE METHOD AND APPARATUS THEREFOR

[75] Inventor: Kousuke Suzuki, Tokyo, Japan

[73] Assignee: Nikon Corporation, Tokyo, Japan

[21] Appl. No.: 08/761,831

[22] Filed: Dec. 6, 1996

[30] Foreign Application Priority Data

Dec. 11, 1995 [JP] Japan .................................. 7-321363

[51] Int. Cl.$^6$ ............................ G03B 27/42; G03B 27/52
[52] U.S. Cl. ............................................. 355/55; 355/53
[58] Field of Search .................................. 355/53, 55, 67

[56] References Cited

U.S. PATENT DOCUMENTS

| | | | |
|---|---|---|---|
| 5,105,075 | 4/1992 | Ohta et al. | 250/201.2 |
| 5,696,623 | 12/1997 | Fujie et al. | 355/53 |
| 5,710,620 | 1/1998 | Taniguchi | 355/53 |

FOREIGN PATENT DOCUMENTS

| | | |
|---|---|---|
| 62-35620 | 2/1987 | Japan . |
| 5-251303 | 9/1993 | Japan . |

*Primary Examiner*—Richard Moses
*Assistant Examiner*—Shival Virmani
*Attorney, Agent, or Firm*—Armstrong, Westerman, Hattori, McLeland & Naughton

[57] ABSTRACT

Disclosed is a method for exposure by projection, having the step of determining an error in magnification of a projection optical system in a position at each of plural image heights of an image, a projection optical system being for projecting an image of a pattern of a mask onto a photosensitizable substrate; and the step of correcting a magnification of projection of the image of the pattern of the mask onto said photosensitizable substrate on the basis of the error in magnification determined in the previous step. Further disclosed is a projection exposure apparatus so adapted as to implement of the method for exposure by projection.

23 Claims, 2 Drawing Sheets

PROJECTION EXPOSURE METHOD AND APPARATUS THEREFOR

BACKGROUND OF THE INVENTION

1. Field of the Invention

The present invention relates to a projection exposure method and an apparatus therefor and, more particularly, to a method of the exposure by projection for transcribing or transferring a pattern of a mask to a photosensitizable substrate at a high degree of sensitivity by an apparatus for the method for the exposure by projection to be employed in a photolithographic process for manufacturing semiconductor elements, liquid crystal displays, image pickup elements (CCD and so on), thin film magnetic heads, and so on. This projection exposure method is adapted particularly to a method for correcting an error in a nonlinear magnification.

2. Description of the Related Art

For a photolithographic process for manufacturing semiconductor elements, liquid crystal display elements, image pickup elements, thin film magnetic heads and so on, there has hitherto been employed mainly a projection exposure apparatus of a stepper type so adapted as to collectively expose a pattern of a reticle, a photomask or the like to each shot area on a photosensitizable substrate such as a photoresist-coated wafer or glass plate via a projection optical system. On the other hand, there has recently been employed a projection exposure apparatus of a slit-scanning type or of a step-and-scanning type or the like, so adapted as to expose a pattern of a reticle one by one onto each of shot areas on a wafer by scanning the reticle and the wafer relative to a projection optical system, in order to meet requirements for exposure of a pattern having a larger area while sustaining high imaging characteristics.

These projection exposure apparatuses must be able to provide a high degree of accuracy in performing alignment. For example, as different circuit patterns are superimposed in plural layers on a wafer for semiconductor elements and so on, it is required that a reticle with a circuit pattern drawn thereon should be aligned accurately with a pattern of each shot area on the wafer in order to subject the circuit pattern of the reticle to exposure to the pattern on the wafer. In this case, an error in magnification (distortion) of a projection optical system should be taken into consideration as a significant factor that may adversely affect accuracy in alignment. Further, as the tendency to miniaturize a larger pattern to be employed for super LSIs and so on has been increased year after year, the demand for improvements in accuracy in alignment of a pattern on a wafer has been strongly increased, accordingly. Therefore, the necessity of sustaining a magnification of projection of the projection optical system within a given scope has also been strengthened remarkably.

The magnification of projection of a projection optical system varies to a slight extent in the vicinity of a predetermined value, for example, with a minute variation in temperature of an apparatus, a minute variation in pressure and temperature of the ambient atmosphere in a clean room with a projection exposure apparatus installed therein, a history of irradiation of energy of light exposed to the projection optical system and so on. Therefore, the magnification of projection of the projection optical system may readily be distorted when such factors for affecting the magnification of projection of the projection optical system are deviated to a slight extent from the acceptable predetermined level. Further, distortion of the magnification of projection by the projection optical system may be caused to occur due to thermal expansion of a reticle or for other reasons. In order to sustain a variation in a magnification of projection of the projection optical system within a predetermined acceptable scope, projection exposure apparatuses developed recently are provided with a projection magnification correction mechanism for sustaining a variation in the magnification of projection in the vicinity of the predetermined acceptable value by minutely adjusting the magnification of projection of the projection optical system. As such projection magnification correction mechanisms, there have been proposed a mechanism of varying a distance between a reticle and a projection optical system, a mechanism of varying a predetermined distance between lenses in a projection optical system, a mechanism of adjusting a predetermined pressure in an air chamber disposed in a projection optical system, and so on.

Where the magnification of projection of the projection optical system may be corrected by such a projection magnification correction mechanism as described hereinabove, there has hitherto been employed a type, for example, in which an error in magnification at a height of 70% of the maximum image height is corrected by using a predetermined reference image height having 70% of the maximum image height. However, there are types of distortion in which an error in magnification changes in a nonlinear shape in accordance with an image height. Among such types of nonlinear distortions, there is a so-called C-shaped distortion in which an error in magnification occurs in a C-letter shape with respect to a change in image height and such C-shaped distortion can prevent error correction. Therefore, recently, a projection exposure apparatus may further be provided with a correction mechanism to correct C-shaped distortion.

It is to be noted herein that in the prior art techniques, the method of magnification error correction, for example, to zero with a one predetermined reference image height is effective for correction of a linear distortion, but it cannot effectively correct linear distortion. Further, disposition of a correction mechanism for correcting C-shaped distortion makes the structure of a projection optical system complicated and increases costs.

SUMMARY OF THE INVENTION

The present invention has as its object the provision a projection exposure method for correcting an error in a nonlinear magnification.

The present invention has as another object the provision of a projection exposure apparatus in such a simplified structure as failing to cause any significant rise in manufacturing costs.

In order to achieve the objects described above, the present invention provides a projection exposure method in which an image of a pattern on a mask is projected on a photosensitizable substrate by means of a projection optical system, which is characterized by the step of determining an error in magnification of the projection optical system in each of a plurality of positions in which heights of the image vary; and the step of correcting a projecting magnification of the image of the pattern of the mask onto the photosensitizable substrate on the basis of the determined error in magnification of the projection optical system.

Further, in order to achieve the another object as described hereinabove, the present invention provides a projection exposure apparatus for implementing the projection exposure method as defined hereinabove.

Other objects, features and advantages of the present invention will become apparent in the course of the description that follows, with reference to the accompanying drawings.

DESCRIPTION OF THE PREFERRED EMBODIMENTS

The present invention will be described in more detail with reference to the accompanying drawings. In the embodiments as will be described hereinafter as examples, the present invention is applied to a projection exposure apparatus of a stepper type for subjecting a pattern on a reticle to collective projection exposure to each shot area of a wafer through a projection optical system.

In accordance with the present invention, an error in a nonlinear magnification, or a nonlinear distortion, can be made smaller as a whole by correcting a linear component of the projection magnification so as to make the absolute values of the errors in residual magnifications, for example, at two different image heights substantially equal to each other. It is preferred in this case that an amount of correction of the projection magnification be determined so as to minimize the maximum value of the errors in the residual magnifications at plural different image heights. This can correct an error in a nonlinear magnification, or a nonlinear distortion, so as to make an error in a maximal residual magnification the minimum value.

Figure 1:
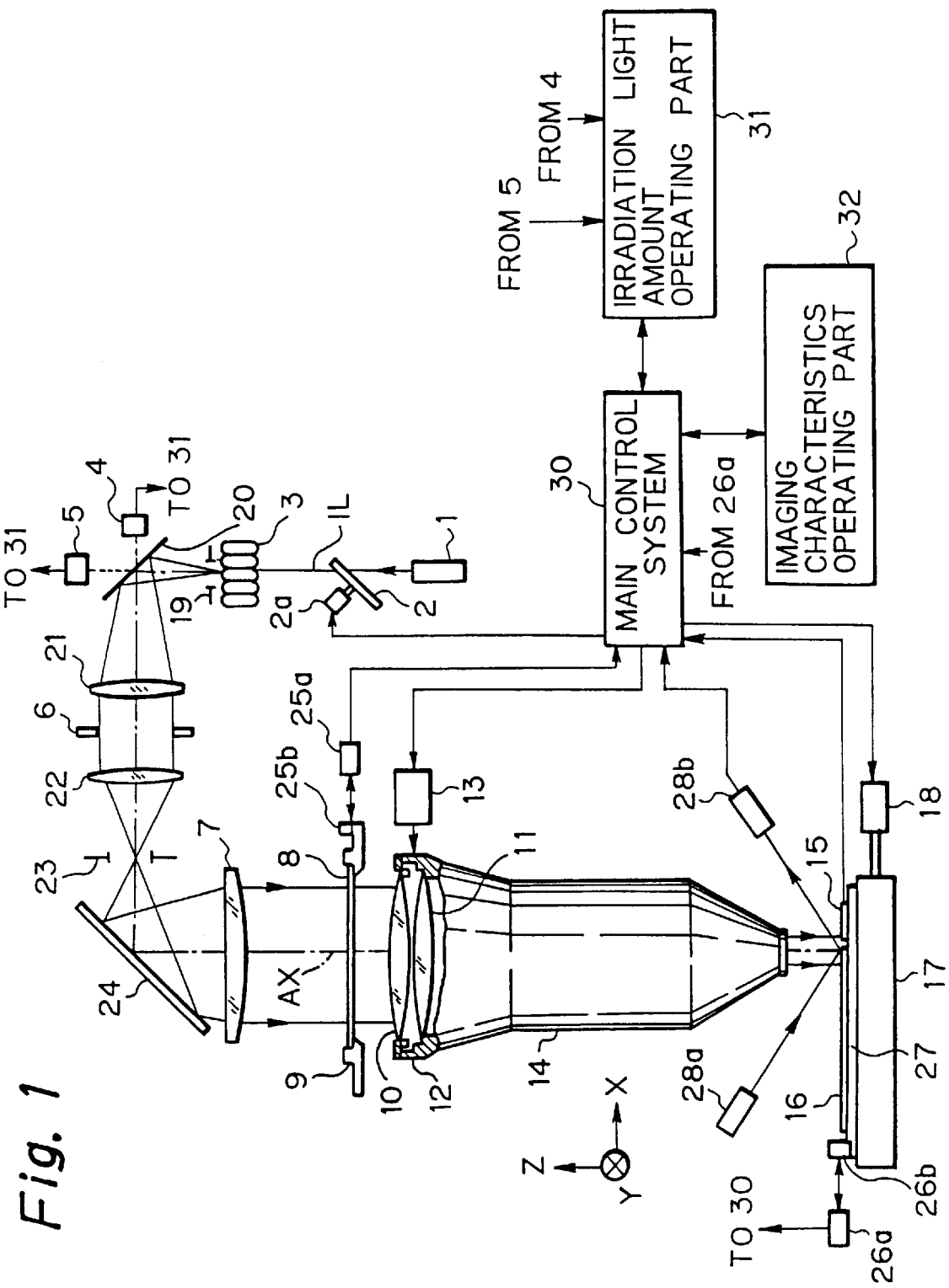
FIG. 1 is a schematic diagram showing a projection exposure apparatus for use in an embodiment of a projection exposure method according to the present invention.

FIG. 1 shows a schematic configuration of a projection exposure apparatus according to an embodiment according to the present invention. As shown in FIG. 1, the projection exposure method according to the present invention is concerned with a method for projecting an image of a pattern of a mask onto a photosensitizable substrate (hereinafter sometimes referred to merely as a substrate) 16 through a projection optical system 14, in which an error in magnification is determined each at different image heights in plural positions in a projection area of the projection optical system 14 and a magnification of projection of the image of the pattern thereof onto the substrate 16 is corrected on the basis of the errors in magnifications determined.

As shown in FIG. 1, the projection exposure apparatus may comprise an irradiation system consisting of a light source 1, a shutter 2, a shutter drive system 2a drivable by a main control system 30 for controlling the opening and closing of the shutter 2, a fly-eye lens 3, a beam splitter 20, a first relay lens 21 struck by a ray of light reflected in a horizontal direction by the beam splitter 20, an integrator sensor 5 struck by the rays of light transmitted through the beam splitter 20, a reticle blind 6, a second relay lens 22, an iris 23, a dichroic mirror 24, and a condenser lens 7 through which the ray of light reaches a reticle 8.

The light source 1 for exposure may comprise a silver lamp, a high frequency generator of YAG laser or an excimer laser light source of KrF excimer laser or ArF excimer laser. If a pulse light source such as an excimer laser light source is employed, the opening and closing of the illuminating ray of light is conducted by the laser light source. Therefore, in this case, no shutter is required.

A ray of light IL for illumination emitted from the light source 1 strikes the shutter 2. When the shutter 2 is opened, the illuminating ray of light IL passes through the shutter 2 and reaches the fly-eye lens 3 via an input lens (not shown). The fly-eye lens 3 produces a number of images of the light source on its outgoing surface from which the ray of light projects. A distribution of illuminance of the illuminating rays of light can be made uniform on the reticle 8 by superimposing light flux from these images of the light source. An iris 19 is disposed in the vicinity of the outgoing surface of the fly-eye lens 3 and the ray of light IL from the images of the light source is allowed to pass through the iris 19, followed by striking the beam splitter 20 having a larger reflection rate and a smaller transmittance rate. The ray of light reflected in a horizontal direction at the beam splitter 20 then strikes the first relay lens 21.

On the other hand, the illuminating ray of light transmitted through the beam splitter 20 enters an incoming surface of the integrator sensor 5 consisting of an optoelectrical sensor. The beam splitter 20 is so disposed as to allow the ray of light transmitted therethrough to strike the integrator sensor 5 in a quantity of light in proportion to an amount of irradiation projecting onto a wafer 16. A signal (an opto-electrically converting signal) detected by the integrator sensor 5 is transmitted to an irradiation light quantity operation unit 31 for operating a quantity of the rays of light irradiated on the wafer 16. The irradiation light quantity operation unit 31 stores conversion coefficients and so on for determining an amount of irradiation on a wafer from the signal detected by the integrator sensor 5. The irradiation light quantity operation unit 31 calculates an amount of irradiation on the wafer on the basis of the signal detected by the integrator sensor 5, and the amount of irradiation calculated is then transmitted to the main control system 30. Further, there may be provided a reflection-amount monitor 4 consisting of an optoelectrical sensor for monitoring an amount of the ray of light reflected from the wafer 16 in a manner as will be described hereinafter. The reflection-amount monitor 4 is disposed in such a way that the ray of light reflected at the wafer 16 is transmitted through a projection optical system 14 and the reticle 8, followed by transmittance through the beam splitter 20 and entry into the reflection-amount monitor 4. A signal detected by the reflection-amount monitor 4 is transmitted to the irradiation light quantity operation unit 31, like the integrator sensor 5, which calculates the quantity of rays of light entered into the reflection-amount monitor 4 and a reflectance of the wafer 16 on the basis of the signal detected by the reflection-amount monitor 4. A quantity of the rays of light entering into the projection optical system 14 is then determined on the basis of the quantity of light calculated by the irradiation light quantity operation unit 31 and transmitted to the main control system 30. To the main control system 30 is connected an imaging characteristics operation unit 32 for calculating a variation in a magnification of projection of the projection optical system 14 and so on.

On the other hand, the illuminating ray of light IL entered into the first relay lens 21 is processed by the reticle blind 6 so as to set a field of vision and transmitted to the second relay lens 22. The ray of light transmitted via the second relay lens 22 then strikes the iris 23, followed by transmittance through the iris 23 and entry into the dichroic mirror 24. The ray of light entered into the dichroic mirror 24 is further turned at its surface at a generally right angle and illuminates a pattern area on the reticle 8 through the condenser lens 7 at a uniform distribution of illumination intensity. Thereafter, the illuminating ray of light IL transmitted through the reticle 8 is transmitted via the projection optical system 14 telecentric at its both sides or its one side, thereby forming an image on a one shot area of the wafer 16, an image being reduced in size from the pattern of the reticle 8. The projection optical system 14 may be set for its magnification of projection as a set value to become, for example, 1 to 5 (1:5) in a ratio of the pattern of the reticle to the pattern formed on the wafer. A further description of this relationship will be made with reference to FIG. 1 by taking the direction parallel to a light axis AX of the projection optical system 14 as a Z-axis, the direction parallel to the plane of the drawing surface of FIG. 1 perpendicular to the Z-axis as an X-axis, and the direction perpendicular to the drawing surface of FIG. 1 as a Y-axis.

The reticle 8 is attached by vacuo on a reticle stage 9 that is disposed so as to be minutely movable in a two-dimensional direction in a plane (an X-Y plane) perpendicular to the light axis AX of the projection optical system 14, thereby allowing an alignment of the reticle 8. At an end portion of the reticle stage 9 is fixed a movable mirror 25b for reflecting laser beams from a laser interferometer 25a. The laser interferometer 25a and the movable mirror 25b always monitor the position of the reticle stage 9 at a resolution rate, for example, of approximately 0.01 micron. Data on the positions of the reticle stage 9 from the laser interferometer 25a is transmitted to the main control system 30 that in turn gives an instruction to a reticle drive unit (not shown) to drive the reticle stage 9 on the basis of the data on the positions of the reticle stage 9. The initial position of the reticle stage 9 may be determined so as to align the reticle 8 in a predetermined reference position at a high degree of accuracy, for example, by a reticle alignment system (not shown).

On the other hand, the wafer 16 is attached by vacuo on a wafer holder (not shown) which in turn is held on a Z-stage 27. The Z-stage 27 is disposed in such a way that it can incline a surface of the wafer 16 in an optional direction with respect to a surface of the projection optical system 14 on which the best possible image can be formed and it also can minutely move the wafer 16 in the direction parallel to the light axis AX (the Z-direction), by the aid of an internal drive unit. The Z-stage 27 is mounted on an XY-stage 17 which in turn is disposed so as to be movable in X- and Y-directions, thereby enabling an optional shot area in plural shot areas on the wafer 16 to be movable to a position of exposure or the like at any optional time. A stage drive unit 18 including a motor and so on is provided so as to drive the XY-stage 17 in both X- and Y-directions. At an end portion of the Z-stage 27 is fixed a movable mirror 26b for reflecting laser beams from a laser interferometer 26a, and the position of the XY-stage on the XY-plane is always monitored by the laser interferometer 26a at a resolution of, for example, approximately 0.01 μm. Data on the positions or speeds of the XY-stage 17 is transmitted to the main control system 30 that in turn controls the stage drive unit 18 on the basis of the data on the positions or speeds thereof.

The projection exposure apparatus according to the present invention is further provided with a focal point detection system of an oblique incidence type, which consists of an irradiation optical system 28a for irradiating a detecting light for forming a pinhole image or a slit image towards the surface of the wafer 16 in an oblique direction with respect to the light axis AX and a light-receipt optical system 28b for allowing a flux of the detecting rays of light reflected at the surface of the wafer 16 to form a pinhole image or the like again on a vibrating slit and for receiving the flux thereof transmitted through the vibrating slit. The focal point detection system consisting of the irradiation optical system 28a and the light-receipt optical system 28b will hereinafter be sometimes referred to collectively as the focal point detection systems 28a and 28b. The focal point detection systems 28a and 28b generate a focus signal for competing with a deviation of the Z-directional position of the surface of the wafer 16 with respect to the surface of the projection optical system 14 on which the best possible image is to be formed and transmit the focus signal to the main control system 30. On the basis of the focus signal transmitted thereto, the main control system 30 drives the Z-stage 27 in an automatic focus system in the Z-direction. In this embodiment, it is to be noted that an angle of a parallel flat-plate glass (plane parallel), although not shown, disposed in advance in the inside of the light-receipt optical system 28b is adjusted in order to reference the image-forming surface to become zero, thereby implementing an automatic focus so as to make the focus signal from the light-receipt optical system 28b zero. As will described hereinafter, when the position of the image forming surface in the imaging characteristics varies, the focus position in the Z-direction of the wafer 16 is adjusted by minutely moving the angle of the parallel flat-plate glass.

Further, the Z-stage 27 is disposed thereon with an irradiation-quantity monitor 15 for monitoring a quantity of irradiation of light, which consists of a photoelectrical sensor for detecting a light amount of illuminating rays of light transmitted through the projection optical system 14. The monitor 15 transmits signals in accordance with the light amount of the light entered thereinto and the signals are then fed to the main control system 30, followed by transmittance through the main control system 30 to the illumination light quantity operation unit 31 which in turn calculates the light amount of the light striking the wafer 16 on the basis of the signals transmitted from the main control system 30.

The projection exposure apparatus in accordance with this embodiment is further provided with a magnification correction mechanism for correcting a magnification of projection of the projection optical system 14 into a linear shape. As shown in FIG. 1, the magnification of projection of the projection optical system 14 is corrected by driving a lens element 10 by a magnification correction controller 13. In this embodiment, the lens element 10 is fixed on the main body of a mirror cylinder through three pieces of shrinkable piezo elements 12 and a lens element 11 is fixed on the main body of the mirror cylinder. The expansion and contraction of the piezo elements 12 allow a control over a distance between the lens element 10 and the lens element 11. Further, the lens element 10 is disposed so as to lean with respect to the surface perpendicular to the light axis AX, thereby enabling these operations to correct the imaging characteristics of the projection optical system 14, for example, the magnification of projection, distortion and so on in a predetermined area. It is to be noted herein that an electrostrictive element or a magnetostrictive element may be employed in place of such piezo elements 12.

A description will then be made of an example of an operation of the projection exposure method according to the present invention with reference to FIG. 1.

The projection exposure apparatus according to the present invention is configured in such a way that the lens elements 10 disposed at an upper portion of the projection optical system 14 is driven in an upward or downward direction by the piezo elements 12, thereby changing a distance between the lens elements 10 and 11 and enabling a correction of the magnification of projection of the projection optical system 14 into a linear shape. In this case, when an amount of a variation in the distance between the lens elements 10 and 11 (a distance variation amount) is referred to as Z and an amount of a variation in the magnification of projection (a magnification variation amount) is referred to as M, the relationship between the distance variation amount and the magnification variation amount can be established as M=a×Z (in which symbol a is a proportional coefficient). In this example, it is provided that the magnification variation amount M is set as an amount of a variation in the magnification in the position where the image height corresponds to 70% of the maximal image height, although it can be noted that, as the magnification variation amount is a reference value, it may be set as an amount of a variation in the magnification in a position in which the image height corresponds to any percentage of the maximal image height thereof. It is further to be noted herein that the amount of the distance between the lens elements 10 and 11 and the proportional coefficient a of the magnification variation amount M may be given by an optical calculation or an experiment. In addition, although the Z-directional position of the surface on which to form the best image may vary by driving the lens elements 10, the main control system 30 adds an offset to the focus signal by adjusting the angle of the parallel flat plate glass in the focal point detection systems 28a and 28b, thereby driving the Z-stage 27 via the stage drive system 18 and maintaining a focused state.

Then, a relation formula (a model formula) indicating a relationship of the amount of irradiation to the projection optical system 14 and a variation in the magnification of projection of the projection optical system 14 is in advance given by an experiment and stored in the main control system 30. In this embodiment, in order to make a calculation easier, there is employed the following model formula represented by a one-stage differential equation as the relation formula:

$$M_7(\tau)=M_7(\tau-\Delta\tau)\times exp(-\tau/T_7)+K_7\times\{1-exp(-\tau/T_7)\}\times P_L\times D \qquad (1)$$

where $M_7(\tau)$ denotes an amount of a variation in magnification in the position of a 70% image height at time $\tau$;

$\Delta\tau$ denotes a sampling cycle of the amount of irradiation;

$T_7$ denotes a time constant in the position of the 70% image height;

$K_7$ denotes a saturation value of an amount of variation in the magnification in the position of the 70% image height (an amount of variation in the magnification per unit amount of irradiation);

$P_L$ denotes an amount of irradiation to be measured; and

D denotes a shutter duty having a value 1 at the time when the shutter 2 opens and a value 0 at the time when it is closed.

Further, there is given a model formula representing the relationship of the amount of irradiation to the reticle 8 with an amount of a variation in the magnification of a projected image due to a thermal expansion of the reticle 8. In this case, too, in order to simplify the formula, there is employed a model formula represented by a one-stage differential equation as follows:

$$m_7(\tau)=m_7(\tau-\Delta\tau)\times exp(-\tau/t_7)+k_7\times\{1-exp(-\tau/t_7)\}\times Q_R\times D \qquad (2)$$

where $m_7(\tau)$ denotes an amount of a variation in magnification resulting from a thermal expansion of the reticle 8 in the position of the 70% image height at time $\tau$;

$\Delta\tau$ has the same meaning as above;

$t_7$ denotes a time constant in the position of the 70% image height;

$k_7$ denotes a saturation value of an amount of a variation in the magnification in the position of the 70% image height (an amount of a variation in the magnification per unit absorption energy);

$Q_R$ denotes an absorption energy of a reticle to be measured; and

D denotes a shutter duty.

Furthermore, the model formulas are given respectively for the projection optical system 14 and the reticle 8 in the position of a 100% image height (maximum image height) in the same manner as described hereinabove.

Then, the amounts of irradiation to the projection optical system 14 and the reticle 8 are determined. In this case, the amount of irradiation to the projection optical system 14 is given as a sum of an amount of irradiation from the upper portion of the projection optical system 14 and an amount of irradiation by light reflected from the surface of the wafer 16.

Now, a description will be made of determining the amounts of irradiation to the projection optical system 14 and the reticle 8.

First, a reticle for exposure to light, as referred to as the reticle 8, is loaded on the reticle stage 9 by a reticle loader (not shown), followed by driving the reticle blind 6 to set a shot area in a predetermined field of vision and measuring an amount of irradiation $P_{wO}$ by an irradiation-amount monitor 15 on the Z-stage 27. At the same time, an output value $I_O$ of the integrator sensor 5 at this time is measured. As the amount of irradiation of the irradiation-amount monitor 15 is in proportion to the output value of the integrator sensor 5, an amount $P_w$ of irradiation to an image surface can be given from an output value I of the integrator sensor 5 at the time of exposure as follows:
ti $P_w=P_{wO}\times I/I_O$ Then, a relationship of a reflectance $r_w$ of the wafer 16 with an output value R of the reflection-amount monitor 4 is determined. As the relationship of the wafer reflectance $r_w$ with the output value R of the reflection-amount monitor 4 may be indicated as will be described hereinafter, it may be represented as follows:

$$R=\alpha\times r_w+\beta \qquad (3)$$

where $\alpha$ and $\beta$ are each a coefficient.

Thereafter, two sheets of reflecting plates (not shown) having different reflectance are disposed on the Z-stage 27 and each of the reflecting plates is transferred to an exposure field of the projection optical system 14 while the reticle 8 and the reticle blind 6 are stayed in the same state. An output value of the reflection-amount monitor 4 at this time is measured. In this case, where the known reflectance of the two sheets of the reflecting plates are indicated as $r_H$ and $r_L$ and output values of the reflection-amount monitor 4 for the two sheets of the reflecting plates are indicated as $R_H$ and $R_L$, respectively, the relation formula may be established from the formula (3) above as follows:

$$R_H=\alpha\times r_H+\beta \qquad (4)$$

$$R_L=\alpha\times r_L+\beta \qquad (5)$$

From the above formulas (4) and (5), the coefficients $\alpha$ and $\beta$ are computed, respectively, to give the following:

$\alpha=(R_H-R_L)/(r_H-r_L)$; and $\beta=(r_H\times R_L-r_L\times R_H)/(r_H-r_L)$.

Further, by monitoring the output value R of the reflection-amount monitor 4 at the time of exposure, a reflectance $r_w$ of the wafer 16 can be given at a real time from the following formula:

$$r_w=(R-\beta)/\alpha \tag{6}$$

It is to be noted herein that, as an illuminance on an image surface and the reflectance of a wafer vary with the kind of a reticle and a vision field of the reticle blind 6, they have to be measured whenever the reticle or the field of vision of the reticle blind 6 is changed.

From the above results, the irradiation amount $P_L$ to the projection optical system 14 can be given from the formula as follows:

$$P_L=(1+r_w)\times P_w \tag{7}$$

Then, an amount of irradiation to the reticle 8 is given. As the output value I of the integrator sensor 5 is in proportion to the amount of irradiation to the reticle surface, $P_R$, the following formula is established.

$$P_R=b\times I \tag{8}$$

where b is a proportional coefficient.

Therefore, a value of the proportional coefficient b is determined by an experiment previously at the time of adjustment. Where an output value of the integrator sensor 5 is indicated as $I_O$ and an amount of irradiation to the reticle surface at that time is indicated as $P_{RO}$, the relationship therebetween is established as follows:

$$P_{RO}=b\times I_O.$$

From this result, the proportional coefficient b can be given from the following formula:

$$b=P_{RO}/I_O.$$

The rays of light irradiated to the reticle are reflected in part and transmitted in part while the rest is absorbed in the reticle. The rates of irradiation, reflection and absorption of the rays of light depend upon a rate of occupation of a pattern in the area of the reticle and the reflectance. As the rate of occupation of the pattern in the area of the reticle, as referred to herein as $\eta_R$, and the reflectance, rR, vary with a reticle to be employed, they have to be determined for each of reticles. The rate $\eta_R$ may also be determined by computing a ratio of output of the irradiation-amount monitor 15 when the reticle 8 is disposed on the reticle stage 9 to output thereof when the reticle 8 is not disposed thereon. Where the output value of the irradiation-amount monitor 15 is indicated as $P_{on}$ when the reticle 8 is disposed on the reticle stage 9 and the output value thereof is indicated as $P_{off}$ when it is not disposed thereon, the rate of occupation of the pattern in the area of the reticle $\eta_R$ can be given by the following formula: $\eta_R=1-(P_{on}/P_{off})$. From the calculation results, the absorption energy $Q_R$ of the reticle 8 may be determined by the formula as follows:

$$Q_R=P_R\times\eta_R\times(1-r_R) \tag{9}$$

By inserting the irradiation amount $P_L$ to the projection optical system 14 and the absorption energy $Q_R$ the reticle 8 as obtained hereinabove into the formulas (1) and (2), respectively, the amount of a variation in the magnification at a 70% image height can be calculated. Likewise, by inserting the irradiation amount $P_L$ to the projection optical system 14 and the absorption energy $Q_R$ of the reticle 8 as obtained hereinabove in the model formula at the 100% image height, the amount of a variation in the magnification at the 100% image height can be calculated at a real time. A comprehensive amount of a variation in the magnification at the 70% image height, $B_A$, can be represented as a sum of the amount of the variation in the magnification of the projection optical system 14, $M_7$, and the amount of a variation in the magnification resulting of a thermal expansion of the reticle 8, $m_7$, as follows:

$$B_A=m_7+M_7 \tag{10}$$

Likewise, a comprehensive amount of a variation in the magnification at the 100% image height, $B_B$, can be represented as a sum of the amount of the variation in the magnification of the projection optical system 14 itself, $M_{10}$, and the amount of a variation in the magnification resulting of a thermal expansion of the reticle 8, $m_{10}$, as follows:

$$B_B=m_{10}+M_{10} \tag{11}$$

Figure 2:
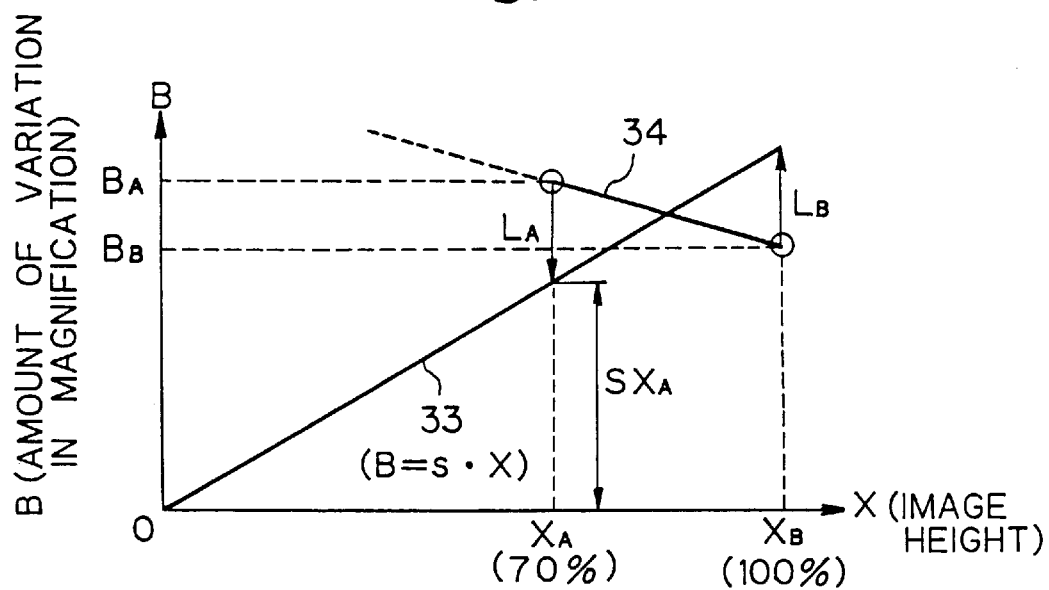
FIG. 2 is a graph for describing a process for determining an optimal amount of correction of magnification on the basis of an amount of a variation in magnifications at image heights in two positions.

FIG. 2 shows a graph plotting the amounts of the variation in the magnification as obtained in the formulas (10) and (11) with respect to the image height. In the table of FIG. 2, the x-axis represents an image height x and the y-axis represents an amount of a variation in magnification, B. A straight line 34 connecting the magnification-variation amount $B_A$ at an image height $x_A$ (70% of the maximum image height) and the magnification-variation amount $B_B$ at an image height $x_B$ (100% of the maximum image height) can be represented by the equation of the first degree as follows:

$$B=Fx+G \tag{12}$$

where
$F=(B_A-B_B)/(x_A-x_B)$ and
$G=(x_A B_B-x_B B_A)/(x_A-x_b)$.

An error in the linear magnification with respect to the image height as represented by the formula (12) above is then corrected by the magnification correction mechanism containing the piezo elements 12 as shown in FIG. 1. In this case, an amount of correction of the magnification is determined so as to distribute the residual magnification errors after correction at the image heights $x_A$ and $x_B$. In other words, in FIG. 2, the magnification correction amount is determined on the basis of a linear relationship as indicated by a straight line 33 passing through the origin (0, 0), which makes the absolute value of the residual magnification error LA in the image height $x_A$ identical to the absolute value of the residual magnification error LB in the image height $x_B$. In this case, where the primary mechanism as indicated by the straight line 33 is represented by B=sx (where s is a proportional coefficient), the following equation can be established:

$$sx_B-B_B=B_A-sx_A \tag{13}$$

Therefore, the proportional coefficient s can be given as $s=(B_A+B_B)/(x_A+x_B)$. Further, in order to correct the amount of the variation in magnification as shown in FIG. 2, it is necessary to correct the magnification for −sx in which the sign for the proportional coefficient s is made inverted.

The amount of correction of the linear distortion at the image height $x_A$, or the 70% image height, can be represented by the product that is obtained by multiplying the proportional coefficient s by the image height $x_A$ and has its sign made negative, i.e. by the product with its sign made negative, $-sx_A$. Thus, the following equation can be established from the equation for the above-described magnification correction mechanism:

$$Z = -sx_A/a \quad (14)$$

From the equation (14) above, a distance Z between the lens elements 10 and 11 for correcting the magnification of projection can be determined, and the piezo elements 12 are driven on the basis of the distance Z so determined, thereby correcting the magnification of projection.

As described hereinabove, the amount of correction of the linear error in magnification with respect to the image height is determined from the error in magnification at the two image heights of 70% and 100%, i.e. a 70% image height and a 100% image height, is determined in this embodiment and it is then corrected by the magnification correction mechanism. Thus, the error in the residual magnification at plural image heights can be decreased as a whole, as compared to the conventional case where the magnification is corrected at a reference image height, for example, 70% of the maximal image height.

It is to be noted herein, however, that although the 70% and 100% rates, i.e. the maximal image height rate, of the maximal image height are selected in this example as shown in FIG. 2, the rate of the reference image height is not required to be limited to a particular one and any rate can be employed. In this case, the formulas and equations as described hereinabove can be applied intact simply by changing the values for the image heights $x_A$ and $x_B$. It is also possible to determine an optimal image height as a reference to correction by simulations or experiments.

In the example as described hereinabove, although an amount of a variation in the magnification of projection with respect to the image heights at two points is computed, it is further possible to compute the amount of a variation in the magnification of projection with respect to the heights of the images at more points. A description will be made of an example with reference to FIG. 3, in which an amount of a variation in the magnification of projection is computed on the basis of the heights of images at n points (where n is 3 or an integer greater than three), It is to be noted herein that the image heights may be in duplicate.

Figure 3:
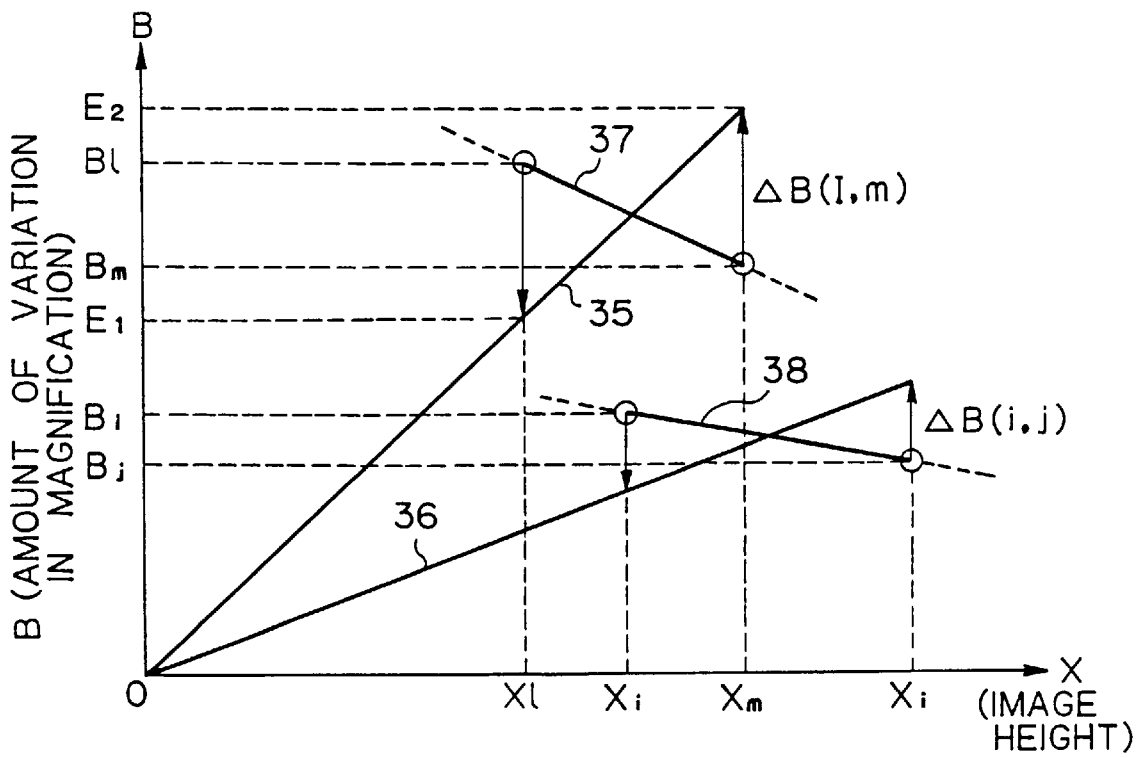
FIG. 3 is a graph for describing a process for determining an optimal amount of correction of magnification on the basis of an amount of a variation in magnifications at image heights in n points.

FIG. 3 shows a graph for describing an example for computing a magnification of projection on the basis of the heights of an image at n points, in which the x-axis indicates an image height x and the y-axis indicates a magnification variation amount B. It is to be noted that FIG. 3 shows an example for computing an amount of the variation in the magnification of projection for brevity of description, where the heights of an image are measured at four points.

First, a computation of the image heights $x_l$ and $x_m$ at certain two points is made in substantially the same manner as described hereinabove. In other words, comprehensive amounts of a variation in magnifications, Bl and Bm, at the image heights $x_l$ and $x_m$ are each computed in the equation as follows:

$$B_l = m_l + M_l \quad (15)$$

where $m_l$ denotes an amount of a variation in the magnification at the image height $x_l$ due to a thermal expansion of the reticle 8; and $M_l$ denotes an amount of a variation in the magnification of the projection optical system 14 itself at the image height $x_l$; and $$B_m = m_m + M_m \quad (16)$$

where $m_m$ denotes an amount of a variation in the magnification at the image height $x_m$ due to a thermal expansion of the reticle 8; and $M_m$ denotes an amount of a variation in the magnification of the projection optical system 14 itself at the image height $x_m$.

A component of a linear error in the magnification with respect to the respective height of an image may be represented by a straight line 37 connecting the amount $B_l$ of variation in the magnification at the image height $x_l$ and the amount $B_m$ of variation in the magnification at the image height $x_m$. A proportional coefficient $s_{lm}$ indicating an inclination of a straight line 35 for distributing residual errors in magnifications at the image heights $x_l$ and $x_m$ after correction may be given by the equation as follows:

$$s_{lm} = (B_l + B_m)/(x_l + x_m) \quad (17)$$

A computation of corresponding proportional coefficients is computed in substantially the same manner as described hereinabove and the error in the residual magnifications at the image heights $x_l$ and $x_m$ is computed in substantially the same manner as above. In this case, where an absolute value of an amount of the error in the residual magnifications for the image heights $x_l$ and $x_m$ is represented as $\Delta B(l,m)$, the residual magnification error amount $\Delta B(l,m)$ represents a difference between the magnification variation amount $B_1$ and an amount $E_1$ of a variation in the magnification at the image height $x_l$ on the straight line 35 or a difference between the magnification variation amount $B_m$ and an amount $E_2$ of a variation in the magnification at the image height $x_m$ on the straight line 35 and it can be given by the equation as follows:

$$\Delta B(l,m) = B_l - s_{lm}x_l (= s_{lm}x_m - B_m) \quad (18)$$

For the rest of the image heights, $x_i$ and $x_j$, a linear error in magnifications with respect to the image heights is represented by a straight line 38. Therefore, where a proportional coefficient indicating an inclination of a straight line 36 for distributing residual errors in magnifications at the image heights $x_i$ and $x_j$ after correction is represented as $s_{ij}$ an absolute value, $\Delta B(i,j)$, of an amount of the error in the residual magnification can be given by the equation as follows:

$$\Delta B(i,j) = B_i - s_{ij}x_i (= s_{ij}x_j - B_j) \quad (19)$$

In FIG. 3, a computation is made of the amounts of the errors in the residual magnifications in two combinations of the image heights $x_l$ and $x_m$ as well as the image heights $x_i$ and $x_j$. It is also possible to compute the amounts of the errors in the residual magnifications in combinations such as $(x_i, x_l)$, $(x_i, x_m)$, $(x_i, x_l)$ and $(x_j, x_m)$. For these combinations, the amounts of the errors in the residual magnifications are computed in substantially the same manner as described hereinabove.

Likewise, amounts of errors in residual magnifications are computed at every two points among image heights at n points, thereby giving the total number of $nC_2$ of absolute values of amounts of errors in residual magnifications, i.e. $\Delta B(1,2), \ldots, \Delta B(l,m), \ldots, \Delta B(i,j)$.

Then, the heights of the images at two points giving the maximum amount of the residual errors are determined among the total number of $nC_2$ of the absolute values of the amounts of the errors in the residual magnifications. In this case, where a proportional coefficient for correcting the linear magnification for the image heights at the two points is represented as $s_{max}$, a distance between the lens elements 10 and 11 can be given on the basis of the proportional coefficient $s_{max}$ by the following equation, in substantially the same manner as by the equation (14) above:

$$Z = -s_{max}x_A/a \quad (20)$$

where $x_A$ is a reference image height for a magnification correction mechanism.

On the basis of the distance Z between the lens elements 10 and 11, the piezo elements 12 are driven via the magnification correction controller 13, thereby correcting the magnification of projection into a linear shape.

The method for correcting the magnification of projection on the basis of the image heights at n points in the manner as described hereinabove comprises a computation of amounts of variations in magnifications for the image heights at two optional points selected from the image heights at n points and a correction of the errors in the residual magnification at the positions of the two image heights at which the amount of the error in the residual magnification at the two image heights becomes maximum so as to become minimum after correction. Therefore, it can reduce the maximum value of the errors of magnifications at the entire image height and transcribe the pattern on the reticle 8 onto the wafer 16 with high accuracy.

In the examples as described hereinabove, the one stage differential equations as indicated by the formulas (1) and (2) above are adopted as model formulas for computing the magnification of projection. It should be noted, however, that any model formula can be applied as long as such a model formula can appropriately compute a variation in the magnification of projection. For example, as an example of such model formulas as corresponding to the formula (1) above for computing an amount $M(\tau)$ of variation in the magnification of projection of a projection optical system at a predetermined height of an image at a time $\tau$, there may also be employed a model formula of a one-stage differential equation as follows:

$$M(\tau) = M_1(\tau - \Delta\tau) \times \exp(-\tau/T_1) + \quad (21)$$
$$k_1 \times \{1 - \exp(-\tau/T_1)\} \times P_L \times D +$$
$$M_2(\tau - \Delta\tau) \times \exp(-\tau/T_2) +$$
$$k_2 \times \{1 - \exp(-\tau\exp(-\tau/T_2)\} \times P_L \times D$$

where $M_1(\tau)$ and $M_2(\tau)$ are components of the amounts of variations in the magnifications at the time $\tau$ corresponding to time constants $T_1$ and $T_2$, respectively; and $k_1$ and $k_2$ are saturation values of the components of the amounts of variations in the magnifications corresponding to the time constants $T_1$ and $T_2$, respectively.

Although only a portion of variation in the amount of irradiation by the irradiation system is taken into consideration in the model formula relating to the variation in the magnification of projection of the projection optical system 14 in the examples as described hereinabove, it is preferred to alter a model formula in instances where the magnification of projection varies due to other factors. For example, if the magnification of projection of the projection optical system 14 will vary with change of ambient atmosphere, it is desired to adopt a model formula, in place of the formula (1) above, as a model formula, for example, at a 70% rate of the maximal image height, as follow:

$$M_7(\tau)=M_7(\tau-\Delta\tau)\times exp(-\tau/T_7) +k_7\times\{1-exp(-\tau/T_7)\}P_LD+C_7\Delta P_{air} (22)$$

where $C_7$ is a proportional coefficient of an amount of variation in the magnification of projection for an amount of variation in atmospheric pressure; and $\Delta P_{air}$ is an amount of variation in the atmospheric pressure.

In the examples as described hereinabove, the magnification of projection is corrected simply on the basis of a variation in the distance between the lens elements 10 and 11 as shown in FIG. 10. It is also possible to correct the magnification of projection by driving more lens elements. In this case, the freedom is increased so that it is possible to compete with other changes in aberration such as, for example, change in the focus position and so on.

Further, as the magnification correction mechanism, there may be employed a magnification correction mechanism using any other method than the method in adjusting the distance between the predetermined lens elements 10 and 11 by driving the piezo elements 12 in the examples as described hereinabove. Such other methods may include a method using a magnification correction mechanism for correcting the magnification of projection into a generally linear shape by changing a reflectance of a gas present within a closed space disposed in the projection optical system, for example, by altering the internal pressure by airtight closing a distance between the particular lenses thereof, It should be understood herein that the present invention is not interpreted in any respect to be restricted to those embodiments and examples as described hereinabove and that it encompasses any variations and modifications without departing from the scope and spirit of the present invention.

EFFECTS OF THE INVENTION

The projection exposure method according to the present invention can correct an error in a nonlinear magnification to a certain extent by correcting a linear component of the error in the magnification of projection so as to make the absolute values of the errors in a residual magnification, for example, with respect to heights of an image at two points substantially equal to each other. In this case, as a means for correcting the magnification of projection, there may be employed, for example, a simplified means for correcting a linear magnification, thereby causing no substantial rise in costs of the projection exposure apparatus according to the present invention.

Further, the projection exposure method according to the present invention can correct an error in a nonlinear magnification so as to minimize an error in the maximal residual magnification when an amount for correcting the magnification of projection is to be determined so as to minimize the maximal value among errors in magnifications at plural image heights, thereby favorably correcting the error in the nonlinear magnification as a whole.

What is claimed is:

1. A projection exposure method comprising the steps of:
   determining an error in magnification of a projection optical system in each of a plurality of image heights which are different from each other, the projection optical system projecting an image of a pattern of a mask onto a substrate; and
   correcting a projecting magnification of the image of the pattern of said mask onto said substrate on the basis of said determined error in magnification.

2. A projection exposure method as claimed in claim 1, wherein the projecting magnification of the image of the pattern of said mask onto said substrate is corrected so as to minimize a maximum value of errors in magnification in plural different image heights, said errors remaining after correction of said projecting magnification.

3. A projection exposure method as claimed in claim 1, wherein the correction of said projecting magnification is effected by adjusting said projection optical system.

4. A projection exposure method as claimed in claim 3, wherein said projection optical system is adjusted by moving at least one of lens elements of said projection optical system.

5. A projection exposure method as claimed in claim 3, wherein said projection optical system is adjusted by varying a reflectance of gas present in a closed space disposed in said projection optical system.

6. A projection exposure method as claimed in claim 1, wherein the projecting magnification of the image of the pattern of said mask onto said substrate is corrected so as to make an absolute value of each of errors in magnification of said projection optical system in two different image heights equal to each other, said errors remaining after correction of said projecting magnification.

7. A projection exposure method as claimed in claim 6, wherein a linear relationship between an amount of correction of said projecting magnification and an image height of said projection optical system is determined so as to make the absolute value of each of the errors in magnification of said projection optical system in two different image heights equal to each other.

8. A projection exposure method as claimed in claim 1, wherein said errors of projecting magnification of is determined on the basis of at least either of variation in a magnification resulting of irradiation of an exposure light to said projection optical system or variation in a magnification resulting of irradiation of said exposure light to said mask.

9. A projection exposure method as claimed in claim 1, wherein plural image heights are image heights having a height of 70% and 100% of an image height of said projection optical system.

10. A projection exposure method as claimed in claim 1, wherein:

two or more image heights are designated as said plural image heights;

for each of combinations of said two image heights out of said two or more image heights, an error in magnification is computed on the basis of a linear relationship between an amount of correction of said projecting magnification and an image height of said projection optical system, said linear relationship being determined so as to make the absolute value of each of the errors in magnification of said projection optical system at said two image heights equal to each other and said errors remaining after correction of said projecting magnification;

two image heights giving the maximum absolute value of said residual error in magnification are selected among said combinations of said two image heights; and a magnification of projection of the image of the pattern of said mask onto said substrate is corrected on the basis of the linear relationship of the amount of correction of said magnification of projection with the image height of said projection optical system determined by the errors in magnifications for said two image heights.

11. A projection exposure apparatus so adapted as to implement the method for exposure by projection as claimed in claim 1.

12. A method for adjusting a projection optical system for projecting an image of a predetermined pattern, comprising the steps of:

determining an error in magnification of a projection optical system in each of a plurality of image heights; and adjusting said projection optical system on the basis of the determined error in magnification.

13. A projection exposure method as claimed in claim 1, wherein plural positions of said different image heights are located in a projection region of said projection optical system.

14. A projection exposure method for projecting an image of a pattern of a mask on a substrate comprises:

determining an optical characteristic of said projection optical system each at plural positions in a plane of an image of said projection optical system; and making correction of an imaging state of said image of the pattern of the mask on said substitute on the basis of the optical characteristic determined.

15. A projection exposure method as claimed in claim 14, wherein said correction of the imaging state thereof comprises an adjustment of said projection optical system.

16. A projection exposure method as claimed in claim 15, wherein said adjustment of said projection optical system is effected by varying an interval of a lens element constituting said projection optical system.

17. A projection exposure method as claimed in claim 16, wherein said correction of the imaging state thereof comprises at least one of correction of a projection magnification and correction of a variation in a focal position.

18. A projection exposure method as claimed in claim 14, wherein two image heights located in the plane of the image of said projection optical system are designated as said plural positions.

19. A projection exposure method as claimed in claim 14, wherein:

two or more image heights of said projection optical system are designated as said plural positions;

for each of combinations of said two image heights out of said two or more image heights, an error in magnification is computed on the basis of a linear relationship between an amount of correction of said projecting magnification and an image height of said projection optical system, said linear relationship being determined so as to make the absolute value of each of the errors in magnification of said projection optical system at said two image heights equal to each other and said errors remaining after correction of said projecting magnification;

two image heights giving the maximum absolute value of said residual error in magnification are selected among said combinations of said two image heights; and a magnification of projection of the image of the pattern of said mask onto said substitute is corrected on the basis of the linear relationship of the amount of correction of said magnification of projection with the image height of said projection optical system determined by the errors in magnification for said two image heights.

20. A projection exposure method, comprising:

determining an optical characteristic each at plural different image heights of a projection optical system for projecting an image of a pattern of a mask onto a substrate; and making correction of an imaging state of said image of the pattern of the mask on said substrate on the basis of the optical characteristic determined.

21. A projection exposure apparatus for implementing a projection exposure method as claimed in claim 14.

22. A method for adjusting a projection optical system for projecting an image of a predetermined pattern, comprising:

determining optical characteristic each at plural positions in a plane of an image of said projection optical system; and adjusting said projection optical system on the basis of the optical characteristics determined.

23. A method for assembling a projection exposure apparatus, comprising:

providing a projection optical system for projecting an image of a pattern of a mask onto a substitute;

providing a calculator for determining an optical characteristic of said projection optical system each at plural positions in a plane of an image of said optical projection; and providing a correction mechanism for correcting an imaging state of aid image of the pattern of the mask on said substrate on the basis of the optical characteristic determined.

\* \* \* \* \*